(12) United States Patent
Kobayashi

(10) Patent No.: US 9,230,842 B2
(45) Date of Patent: Jan. 5, 2016

(54) SUBSTRATE PROCESSING APPARATUS

(75) Inventor: Sensho Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 235 days.

(21) Appl. No.: 13/824,637

(22) PCT Filed: Sep. 21, 2011

(86) PCT No.: PCT/JP2011/071495
§ 371 (c)(1),
(2), (4) Date: Jun. 4, 2013

(87) PCT Pub. No.: WO2012/039426
PCT Pub. Date: Mar. 29, 2012

(65) Prior Publication Data
US 2013/0309045 A1 Nov. 21, 2013

(30) Foreign Application Priority Data
Sep. 22, 2010 (JP) ................................. 2010-212490

(51) Int. Cl.
*H01L 21/677* (2006.01)
*H01L 21/67* (2006.01)

(52) U.S. Cl.
CPC .... *H01L 21/67739* (2013.01); *H01L 21/67173* (2013.01); *H01L 21/67184* (2013.01); *H01L 21/67196* (2013.01); *H01L 21/67745* (2013.01)

(58) Field of Classification Search
CPC .................. H01L 21/67173; H01L 21/67739; H01L 21/67196; H01L 21/67184; H01L 21/67745
USPC .......................................... 414/217, 939, 805
See application file for complete search history.

(56) References Cited

U.S. PATENT DOCUMENTS

| 6,168,667 B1 * | 1/2001 | Yoshioka ....................... 118/715 |
| 2004/0238122 A1 | 12/2004 | Ishizawa et al. |
| 2005/0005849 A1 * | 1/2005 | Masuoka ....................... 118/719 |

(Continued)

FOREIGN PATENT DOCUMENTS

| CN | 1854839 | 11/2006 |
| CN | 101103452 | 1/2008 |
| JP | 10-144765 A | 5/1998 |
| JP | 2003-59999 A | 2/2003 |
| JP | 2006-303013 A | 11/2006 |

(Continued)

OTHER PUBLICATIONS

International Search Report mailed Nov. 15, 2011 in PCT/JP2011/071495.

*Primary Examiner* — Kaitlin Joerger
(74) *Attorney, Agent, or Firm* — Rothwell, Figg, Ernst & Manbeck, P.C.

(57) ABSTRACT

Disclosed is a substrate processing apparatus including: a housing section configured to house a substrate; a transfer chamber that includes a plurality of airtight chambers connected to the periphery thereof, and a transfer mechanism provided therewithin, each of the plurality of airtight chambers being configured to process the substrate under an airtight state, and the transfer mechanism being configured to transfer the substrate to and from the airtight chambers; a carry-in section configured to carry the substrate into the transfer chamber via a first opening provided in the transfer chamber; and a carry-out section configured to carry out the substrate discharged from a second opening provided at a different position from that of the first opening of the transfer chamber, to the housing section, without returning the substrate to the transfer chamber.

7 Claims, 11 Drawing Sheets

(56) References Cited

U.S. PATENT DOCUMENTS

2006/0231027 A1  10/2006  Iwabuchi
2007/0107845 A1   5/2007  Ishizawa et al.
2007/0186850 A1*  8/2007  Matsuoka et al. ............ 118/719
2009/0259335 A1  10/2009  Ikeda et al.
2010/0040437 A1   2/2010  Iwabuchi
2013/0009177 A1*  1/2013  Chang et al. .................... 257/88

FOREIGN PATENT DOCUMENTS

| JP | 2007-149973 A | 6/2007 |
| KR | 10-2006-0109852 A | 10/2006 |
| KR | 10-2007-0118208 A | 12/2007 |
| KR | 10-2008-0008411 A | 1/2008 |
| WO | 03/017354 A1 | 2/2003 |
| WO | 2007/061116 A1 | 5/2007 |

* cited by examiner

SUBSTRATE PROCESSING APPARATUS

CROSS REFERENCE TO RELATED APPLICATION

This application is a 35 U.S.C. 371 National Phase Entry Application from PCT/JP2011/071495, filed Sep. 21, 2011, which claims the benefit of Japanese Patent Application No. 2010-212490 filed Sep. 22, 2010, the disclosures of which are incorporated herein in their entirety by reference.

TECHNICAL FIELD

The present disclosure relates to a multi-chamber-type substrate processing apparatus that can perform a processing at high efficiency.

BACKGROUND ART

There is a substrate processing apparatus in which a plurality of substrate processing sections are connected, and a substrate is transferred among the substrate processing sections (See, e.g., Patent Literature 1). As an example of such a substrate processing apparatus, there is a multi-chamber-type substrate processing apparatus that includes a cluster including a transfer chamber and a plurality of chambers connected to the periphery of the transfer chamber, in which a substrate is transferred to each of the chambers by a transfer aim provided within the transfer chamber and is processed within each of the chambers. Also, as an example of the multi-chamber-type substrate processing apparatus, there is a multi-cluster-type substrate processing apparatus that includes a plurality of clusters connected to each other in line, in which a substrate is transferred to each of the clusters by being conveyed among the clusters (See, e.g., Patent Literature 2).

FIG. 11 is schematic plan view illustrating an example of a conventional substrate processing apparatus. FIG. 11 illustrates an example of a multi-cluster-type substrate processing apparatus that includes a first cluster 400 and a second cluster 500, in which a substrate is carried into the first cluster 400, and the second cluster 500 is connected to the first cluster 400 in line. The first cluster 400 includes a transfer chamber 401 including a transfer arm A401, and chambers 402 and 403 connected to the periphery of the transfer chamber 401. The second cluster 500 includes a transfer chamber 501 including a transfer arm A501, and chambers 502 and 503 connected to the periphery of the transfer chamber 501.

A load-lock chamber 300 is connected to one end of the first cluster 400, and a relay section 401a is provided to the other end of the first cluster 400. The substrate that has been processed within the first cluster 400 and the second cluster 500 is carried out from the first cluster 400 through a load-lock chamber 300. The first cluster 400 is connected to the second cluster 500 via the relay section 401a. The load-lock chamber 300 is connected to an atmospheric transfer section 200 that transfers the substrate to/from a housing section 100 under an atmospheric pressure state.

Also, the load-lock chamber 300 is connected to an exhaust section 301 and an opening section 302 via a valve V301, in which the exhaust section 301 is configured to decompress the inside to the pressure within the transfer chamber 401, and the opening section 302 is configured to recover the inside to the atmospheric pressure within the atmospheric transfer section 200. The atmospheric transfer section 200 includes a transfer arm A200 transferring the substrate disposed therewithin. The housing section 100 houses a plurality of wafers W0 to be used as substrates. Hereinafter, a process of substrate-processing on the wafers W0 housed in the housing section 100 by the conventional multi-cluster-type substrate processing apparatus illustrated in FIG. 11 will be described.

The transfer arm A200 takes out one wafer W0 to be processed from the housing section 100, and transfers the wafer W0 to the load-lock chamber 300 to store therein. The transfer arm A401 receives the wafer W0 within the load-lock chamber 300 and carries the wafer W0 into the transfer chamber 401. When the wafer W0 carried into the transfer chamber 401 is processed within, for example, the chamber 403, the wafer W0 within the transfer chamber 401 is transferred into the chamber 403 by the transfer atm A401. When the processing within the chamber 403 is completed, the transfer arm A401 transfers the wafer W0 within the chamber 403 into the transfer chamber 401, and then transfers the wafer W0 to the load-lock chamber 300 to store therein.

The transfer a in A200 receives the wafer W0 within the load-lock chamber 300 and carries out the wafer W0 to the housing section 100. When the wafer W0 carried into the transfer chamber 401 is processed within, for example, the chamber 502 included in the second cluster 500, the transfer arm A401 transfers and stores the wafer W0 into the relay section 401a. The transfer arm A501 receives the wafer W0 within the relay section 401a and transfers the wafer W0 to the transfer chamber 501. Then, the transfer aim A501 transfers the wafer W0 within the transfer chamber 501 to the chamber 502.

When the processing within the chamber 502 is completed, the transfer aim A501 transfers the wafer W0 within the chamber 502 into the transfer chamber 501, and further transfers and stores the wafer W0 into the relay section 401a. The transfer aim A401 receives the wafer W0 within the relay section 401a and carries the wafer W0 into the transfer chamber 401. Then, the transfer arms A401 and A200 carry out the wafer W0 within the transfer chamber 401 to the housing section 100 via the load-lock chamber 300.

PRIOR ART

Patent Literature

Patent Literature 1: Japan Patent Laid-open Publication 2007-149973

Patent Literature 2: Japan Patent Laid-open Publication H10-144765

SUMMARY OF INVENTION

Problems to be Solved

However, the conventional art has a problem in that the efficiency of a processing is reduced because a step of conveying the substrate to/from a carry-out side cluster (first cluster 400) is required when the substrate is carried out from the other cluster (second cluster 500) connected in line to the carry-out side cluster (first cluster 400) from which the substrate can be carried out.

The present disclosure has been made by focusing on the above problems. An object of the present disclosure is to provide a multi-chamber-type substrate processing apparatus that can perform a processing at high efficiency.

Means for Solving the Problems

The substrate processing apparatus according to the present disclosure includes: a housing section configured to house a substrate; a transfer chamber that includes a plurality of airtight chambers connected to the periphery thereof, and a transfer mechanism provided therewithin, each of the plurality of airtight chambers being configured to process the substrate under an airtight state, and the transfer mechanism being configured to transfer the substrate to and from the airtight chambers; a carry-in section configured to carry the substrate into the transfer chamber via a first opening provided in the transfer chamber; and a carry-out section configured to carry out the substrate discharged from a second opening provided at a different position from that of the first opening of the transfer chamber, to the housing section, without returning the substrate to the transfer chamber.

In the present disclosure, by the carry-in section provided at one end of the transfer chamber, the substrate is carried from the housing section into the transfer chamber. The substrate carried into the transfer chamber via the first opening is processed by being transferred to each of the airtight chambers. The substrate that has been processed is discharged from the second opening at the different position from that of the first opening to the carry-out section. The carry-out section carries out the substrate to the housing section without returning the substrate to the transfer chamber.

The substrate processing apparatus according to the present disclosure further includes a carry-out chamber that includes the carry-out section provided therewithin, wherein the carry-out chamber is provided with a pressure control section configured to control an inner pressure, and the carry-out section is configured to carry in the substrate from the transfer chamber by controlling the inner pressure to almost the same level as that of the transfer chamber by the pressure control section, and to carry out the substrate to the housing section by controlling the inner pressure to almost the same level as that of the housing section by the pressure control section.

In the present disclosure, the carry-out chamber serves as a load-lock chamber, which decompresses the inside to the pressure within the transfer chamber by the pressure control section, and carries the substrate from the transfer chamber into the carry-out chamber by the carry-out section. Then, the carry-out chamber pressurizes the inside to the pressure, such as an atmospheric pressure, of the housing section by the pressure control section, and carries out the substrate from the transfer chamber to the housing section by the carry-out section.

The substrate processing apparatus according to the present disclosure further includes: a pressure control chamber provided between the carry-out section and the transfer chamber, and a pressure control section which controls a pressure of the pressure control chamber to a vacuum state before the substrate is discharged from the transfer chamber to the pressure control chamber, and controls the pressure of the pressure control chamber to an atmospheric pressure state before the substrate is carried out from the pressure control chamber to the carry-out section.

In the present disclosure, the pressure control chamber is provided between the carry-out section and the transfer chamber. The pressure control section controls a pressure of the pressure control chamber to a vacuum state before the substrate is discharged from the transfer chamber to the pressure control chamber. Also, the pressure control section controls the pressure of the pressure control chamber to an atmospheric pressure state before the substrate is carried out from the pressure control chamber to the carry-out section.

In the substrate processing apparatus according to the present disclosure, a plurality of transfer chambers are connected in line to be able to transfer the substrate to and from the transfer chambers, and the carry-in section is configured to carry the substrate into a transfer chamber disposed at the front side.

In the present disclosure, to the transfer chamber at the front side from among the plurality of transfer chambers connected in line, the substrate is carried in from the housing chamber by the carry-in section. The substrate carried into the transfer chamber at the front side is transferred to and from the transfer chambers connected in line, and is conveyed to the transfer chamber at a rearmost side. By the carry-out section provided in the transfer chamber at the rearmost, the substrate is carried out to the housing section.

In the substrate processing apparatus according to the present disclosure, the transfer chambers are connected along a nearly horizontal direction, and the carry-out section includes a vertically moving section configured to move the substrate carried in from the transfer chambers to an upper side or a lower side of the transfer chambers, and a parallel moving section that is disposed above or below the transfer chambers, and moves the substrate moved by the vertically moving section to the housing section in almost parallel to a connection direction of the transfer chambers.

In the present disclosure, the substrate carried into the transfer chamber at the front side is transferred to the transfer chamber at the rear side via the plurality of transfer chambers connected along the horizontal direction. The substrate transferred to the transfer chamber at the rear side is transferred toward an upper side or a lower side of the plurality of transfer chambers connected along the horizontal direction, further transferred above or below the transfer chambers in the horizontal direction, and then carried out to the housing section.

In the substrate processing apparatus according to the present disclosure, the carry-out section is provided with a heating unit configured to heat the substrate.

In the present disclosure, the substrate that has been processed within the airtight chamber is further subjected to a heating processing by the carry-out section, and is carried out to the housing section.

In the substrate processing apparatus according to the present disclosure, the carry-out section is provided with a cooling unit configured to cool the substrate.

In the present disclosure, the substrate that has been processed within the airtight chamber is further subjected to a cooling processing by the carry-out section, and is carried out to the housing section.

In the substrate processing apparatus according to the present disclosure, the carry-out section is provided with a cleaning unit configured to clean the substrate.

In the present disclosure, the substrate that has been processed within the airtight chamber is further subjected to a cleaning processing by the carry-out section, and is carried out to the housing section.

Effect of the Invention

According to an aspect of the apparatus, a carry-out section is provided that carries out the substrate from the transfer chamber to the housing section. Thus, it is possible to perform a processing at high efficiency.

DETAILED DESCRIPTION OF THE INVENTION

Exemplary Embodiment 1

Hereinafter, an exemplary embodiment will be specifically described with reference to the drawings. A substrate processing apparatus according to the present disclosure performs a processing such as thin film formation, for example, under a vacuum state or an atmospheric state on a substrate such as, for example, a silicon wafer, a glass substrate and a plastic substrate. The substrate processing apparatus includes a cluster that includes a transfer chamber and a plurality of chambers (airtight chambers) each connected to the periphery of the transfer chamber. A substrate within the transfer chamber is transferred to each of the chambers and is subjected to various kinds of processing within each of the chambers. Also, the chamber connected to the transfer chamber is not limited to a chamber in which the substrate is processed, and may be provided as, for example, a sample chamber of an electron microscope and various kinds of spectrometers in order to inspect the substrate under a vacuum state. The substrate processing apparatus includes one cluster or a plurality of clusters connected to each other in line. In the present exemplary embodiment, a tandem substrate processing apparatus including two clusters connected in line is described as an example. Also, a wafer will be exemplified as a substrate.

Figure 1:
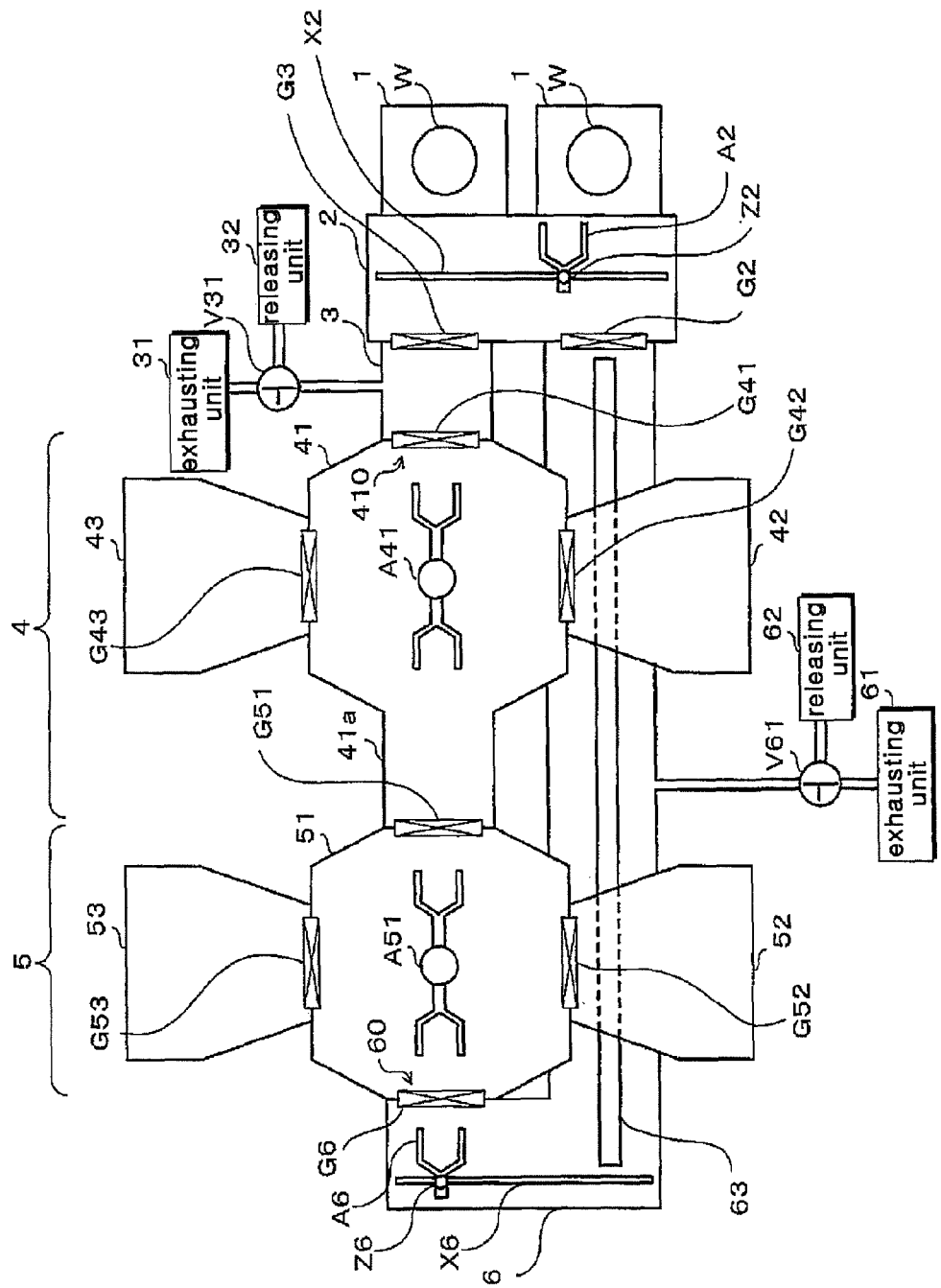
FIG. 1 is a schematic plan view illustrating a substrate processing apparatus according to one exemplary embodiment.
Figure 2:
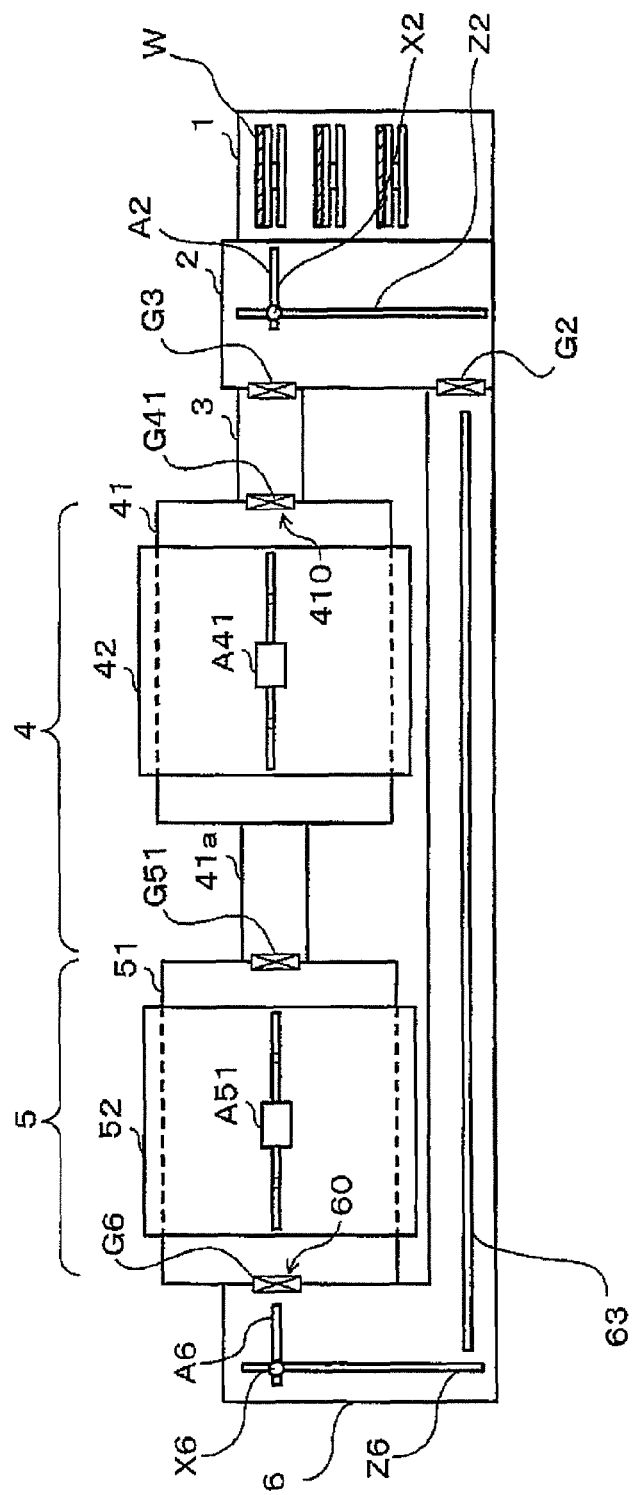
FIG. 2 is a schematic side view illustrating a substrate processing apparatus according to one exemplary embodiment.
Figure 3:
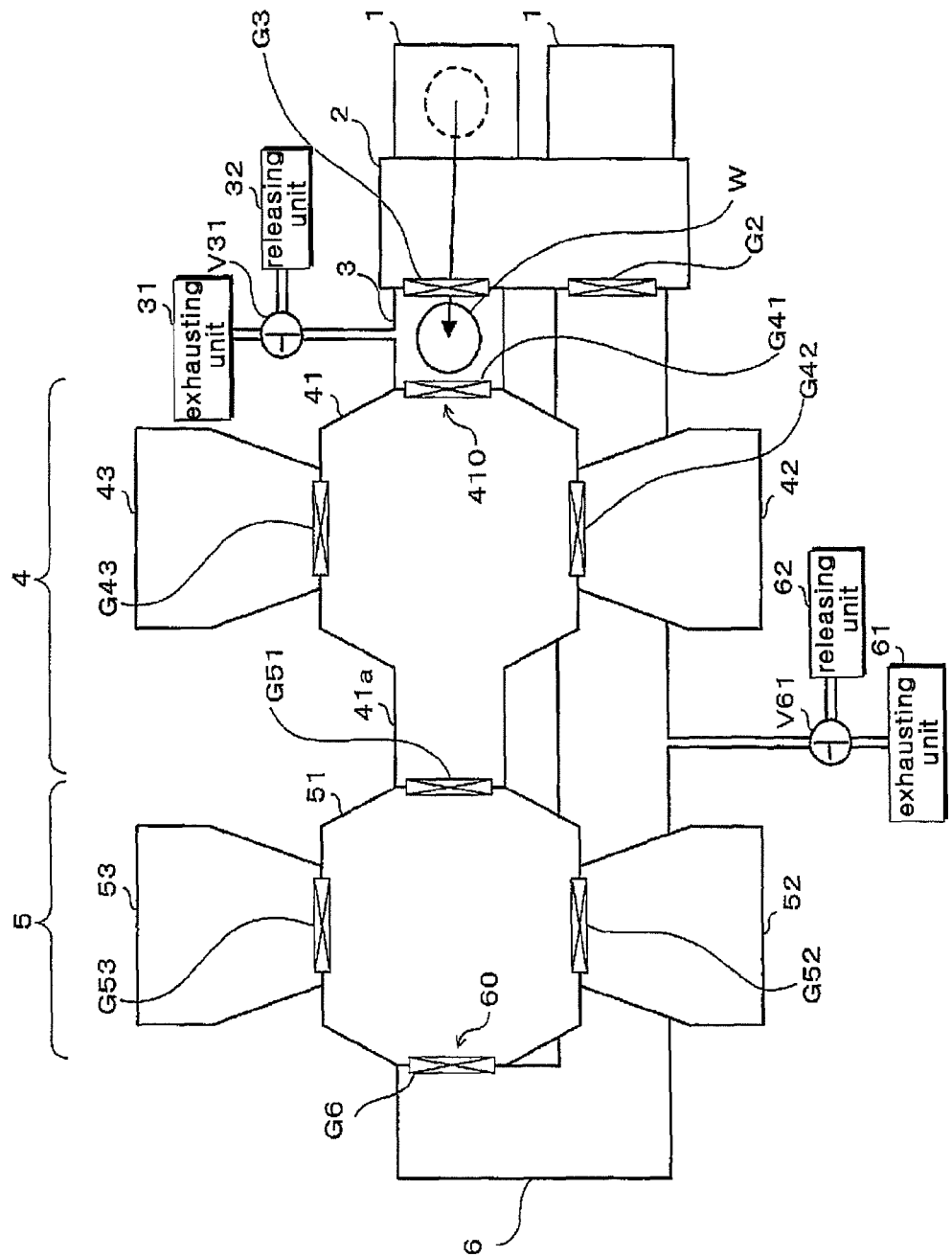
FIG. 3 is an explanatory view illustrating a transfer process.

FIG. 1 and FIG. 2 are a schematic plan view and a schematic side view, respectively, each illustrating a substrate processing apparatus according to one exemplary embodiment. The substrate processing apparatus includes a housing section 1 configured to house a wafer W, an atmospheric transfer section 2 configured to transfer the wafer W under an atmospheric state, a load-lock chamber 3 configured to adjust the inside pressure, a first cluster 4 and a second cluster 5 each configured to process the substrate therewithin, and a carry-out chamber 6 that includes a carry-out section configured to carry out the wafer W therewithin as described below. The first cluster 4 and the second cluster 5 are connected to each other in line, and the substrate is able to be transferred to the second cluster 5 via the first cluster 4. The housing section 1 houses a plurality of wafers W to be used as substrates.

The atmospheric transfer section 2 includes a rotatable and extendable transfer arm A2, and a horizontally moving section X2 and a vertically moving section Z2 which moves the transfer arm A2 in a horizontal direction and a vertical direction, respectively. The atmospheric transfer section 2 is connected to an opening provided at one end of the load-lock chamber 3 via a gate valve G3. An opening provided at the other end of the load-lock chamber 3 is connected to a first opening 410 provided at one end of the first cluster 4 via a gate valve G41. The load-lock chamber 3 becomes an airtight state by closing the gate valves G3 and G41.

Also, the load-lock chamber 3 is connected to an exhaust section 31 configured to decompress the inside and an opening section 32 configured to recover the inside to an atmospheric pressure, via a valve V31. The opening section 32 gradually introduces an inert gas such as, for example, a nitrogen gas and an argon gas into the load-lock chamber 3, thereby controlling the inside of the load-lock chamber 3 to an atmospheric pressure state. The valve V31 is a switching valve that connects any one of the exhaust section 31 and the opening section 32 to the load-lock chamber 3. The first cluster 4 includes a transfer chamber 41 including a rotatable and extendable transfer arm A41, and chambers 42 and 43 disposed at the periphery of the transfer chamber 41. The transfer arm A2 and the load-lock chamber 3 serve as a carry-in section that carries the wafer W into the transfer chamber 41.

Openings provided at the lateral surfaces of the transfer chamber 41 are connected to openings provided at the chambers 42 and 43 via gate valves G42 and G43, respectively. The first cluster 4 is provided with a relay section 41a. An opening provided at the relay section 41a is connected to an opening provided at one end of the second cluster 5 via a gate valve G51. The second cluster 5 includes a transfer chamber 51 including a rotatable and extendable transfer arm A51, and chambers 52 and 53 disposed at the periphery of the transfer chamber 51. Openings provided at the lateral surfaces of the transfer chamber 51 are connected to openings provided at the chambers 52 and 53 via gate valves G52 and G53.

At the other end of the transfer chamber 51, a tubular carry-out chamber 6 is provided. The carry-out chamber 6 extends and bends from the other end of the transfer chamber 51 toward the lower side of the first cluster 4 and the second cluster 5, and then extends below the first cluster 4 and the second cluster 5 in almost parallel to the connection direction of the first cluster 4 and the second cluster 5, and is connected to the atmospheric transfer section 2. A second opening 60 provided at the other end of the transfer chamber 51 is connected to an opening provided at one end of the carry-out chamber 6 via a gate valve G6. The second opening 60 is disposed at a position facing the first opening 410. Herein, the wafer W that has been subjected to a film formation processing in the first cluster 4 and the second cluster 5 is discharged from the second opening 60, and the wafer W to be subjected to a film formation processing in the first cluster 4 and the second cluster 5 is carried in to the first opening 410. Also, although in the present exemplary embodiment, the first opening 410 is disposed to a position facing the second opening 60, the present disclosure is not limited thereto. When the first opening 410 and the second opening 60 are disposed at different positions from the opposite positions, they may be positioned elsewhere. An opening provided at the other end of the carry-out chamber 6 is provided with a gate valve G2, and connected to the atmospheric transfer section 2 via the gate valve G2. The carry-out chamber 6 becomes an airtight state by closing the gate valves G6 and G2.

The carry-out chamber 6 includes a rotatable and extendable transfer arm A6, a horizontally moving section X6 and a vertically moving section Z6 which move the transfer arm A6 in a horizontal direction and a vertical direction, respectively, and a parallel moving section 63 which moves the wafer W toward the atmospheric transfer section 2 in almost parallel to the connection direction of the first cluster 4 and the second cluster 5. The transfer arm A6, the horizontally moving section X6, the vertically moving section Z6 and the parallel moving section 63 serve as a carry-out section that carries out the wafer W from the transfer chamber 51 to the atmospheric transfer section 2 connected to the housing section 1. The parallel moving section 63 is, for example, a moving stage that uses a ball screw rotated by a motor or a linearly reciprocating linear motor, which moves the disposed wafer W. Also, the parallel moving section 63 may be a belt conveyor.

The carry-out chamber 6 is connected to an exhaust section 61 configured to decompress the inside and an opening section 62, which in turn, configured to recover the inside to an atmospheric pressure, via a valve V61. The valve V61 is a switching valve that connects any one of the exhaust section 61 and the opening section 62 to the carry-out chamber 6. The opening section 62 gradually introduces an inert gas such as, for example, a nitrogen gas and an argon gas into the carry-out chamber 6, thereby controlling the inside of the carry-out chamber 6 to an atmospheric pressure state. The exhaust section 61 and the opening section 62 serve as a pressure control section configured to control the pressure within the carry-out chamber 6. The transfer arm A2 including a fork type holding unit which holds the wafer W at one end thereof is configured to be rotated in such a manner that the holding unit faces the housing section 1, and faces the load-lock chamber 3 or the carry-out chamber 6 which is opposite to the housing section 1. Then, the transfer arm A2 extends to transfer the wafer W held by the holding unit to a predetermined position, and completes the transfer by releasing the holding of the wafer W and contracting.

The transfer arm A41 including fork type holding units which hold the wafer W at both ends thereof, is configured to be rotated in such a manner that the holding units face the load-lock chamber 3, the chambers 42 and 43, and the relay section 41a. Then, the transfer arm A41 extends to move the wafer W held by the holding units to a predetermined position, and transfers the wafer W to a predetermined position by releasing the holding of the wafer W and contracting. The transfer arm A51 including fork type holding units which hold the wafer W at both ends thereof, is configured to be rotated in such a manner that the holding units face the relay section 41a, the chambers 52 and 53, and the carry-out chamber 6. Then, the wafer W is transferred to a predetermined position in the same manner as above. The transfer arm A6 includes a fork type holding unit which holds the wafer W at one end thereof. The transfer arm A6 extends to receive the wafer W held by the transfer arm A51, and carries the wafer W into the carry-out chamber 6 by contracting. Hereinafter, the process of transferring the wafer W housed in the housing section 1 using the substrate processing apparatus will be described.

FIGS. 3 to 7 are explanatory views illustrating a transfer process. The opening section 32 is connected to the load-lock chamber 3 via the valve V31, and the inside of the load-lock chamber 3 becomes an atmospheric pressure state by the opening section 32. One wafer W from the housing section 1 is held by the transfer arm A2. When the gate valve G3 is opened, the wafer W is carried into the load-lock chamber 3 by the transfer arm A2 in the atmospheric pressure state. Then, the gate valve G3 is closed (see FIG. 3).

The exhaust section 31 is connected to the load-lock chamber 3 via the valve V31, and the inside of the load-lock chamber 3 is decompressed to almost the same level as that of a vacuum state of the transfer chamber 41 by the exhaust section 31, and then the gate valve G41 is opened. When the wafer W within the load-lock chamber 3 is carried into the transfer chamber 41 of the first cluster 4 by the transfer arm A41, the gate valve G41 is closed. When the wafer W carried into the transfer chamber 41 is subjected to a processing within, for example, the chamber 43, the gate valve G43 is opened. Then, the wafer W is transferred to the chamber 43 by the transfer arm A41, and the gate valve G43 is closed.

When the processing on the wafer W within the chamber 43 is completed, the gate valve G43 is opened. Then, the wafer W is returned into the transfer chamber 41 by the transfer arm A41, and the gate valve G43 is closed. When all of the predetermined processing on the wafer W are completed, the gate valve G41 is opened. Then, the wafer W is transferred into the load-lock chamber 3 by the transfer arm A41 in the vacuum state, and the gate valve G41 is closed. Since the opening section 32 is connected to the load-lock chamber 3 via the valve V31, the inside of the load-lock chamber 3 is returned to the atmospheric pressure state by the opening section 32. Then, the gate valve G3 is opened, the wafer W is returned to the housing section 1 by the transfer arm A2, and the gate valve G3 is closed.

Figure 4:
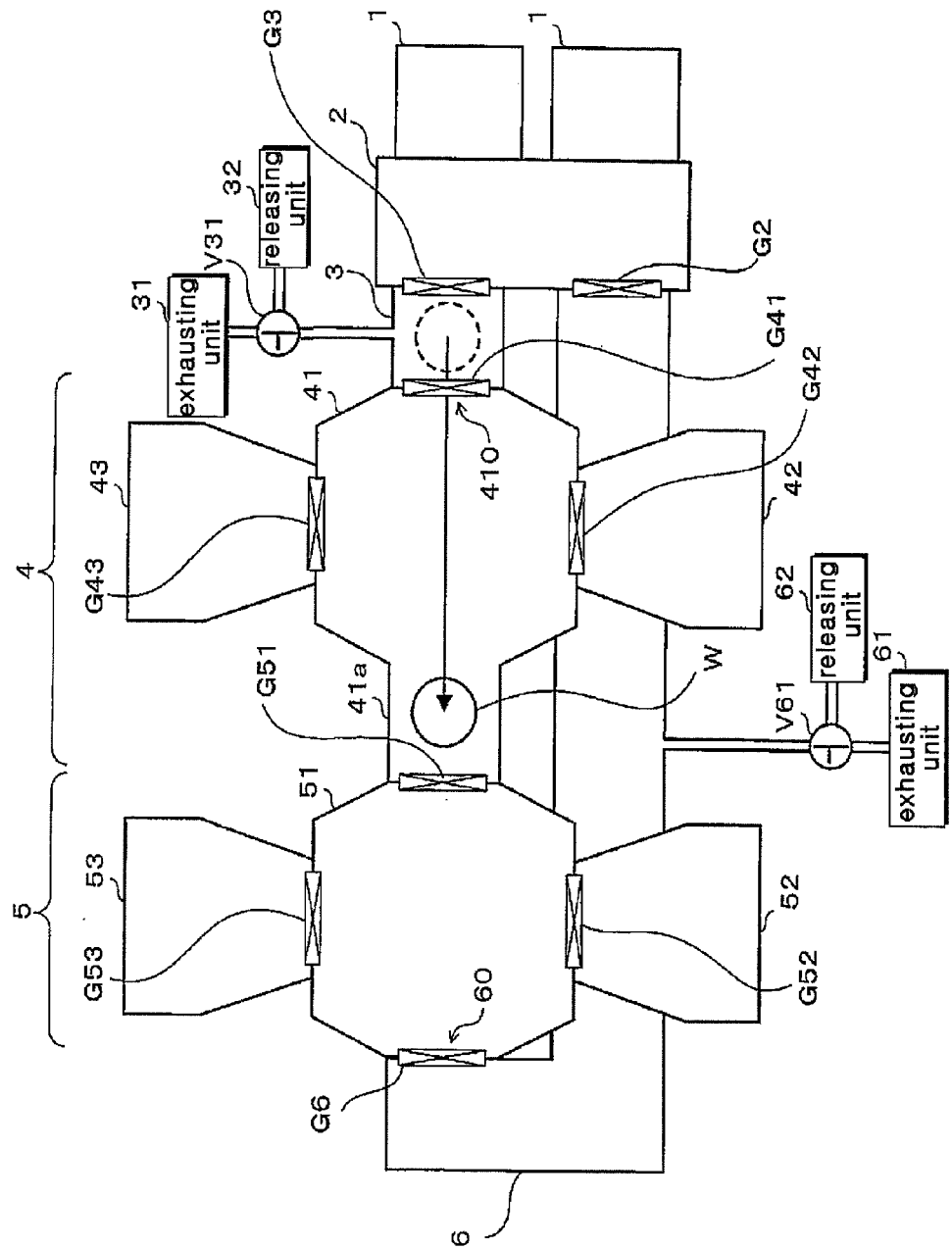
FIG. 4 is an explanatory view illustrating a transfer process.
Figure 5:
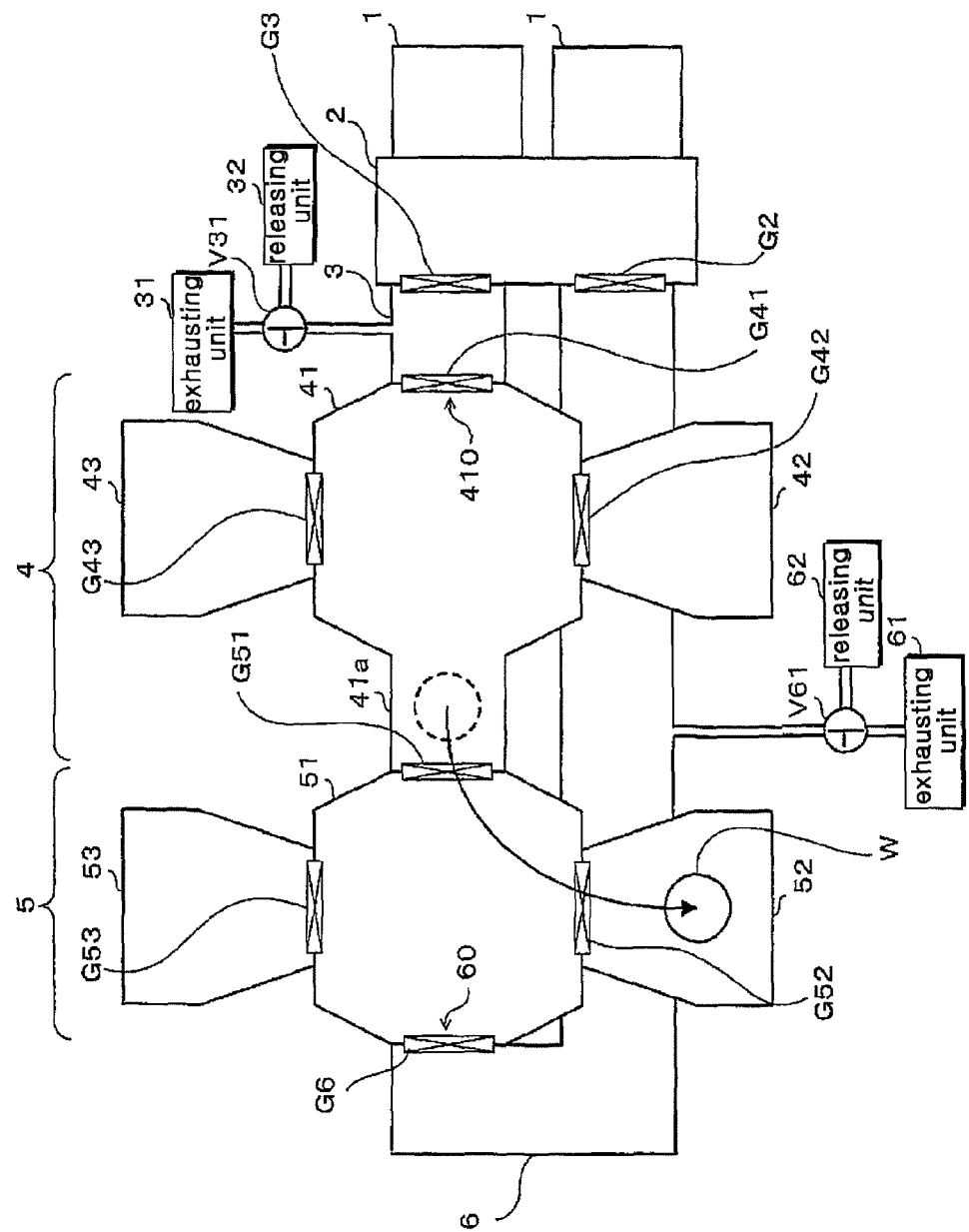
FIG. 5 is an explanatory view illustrating a transfer process.
Figure 6:
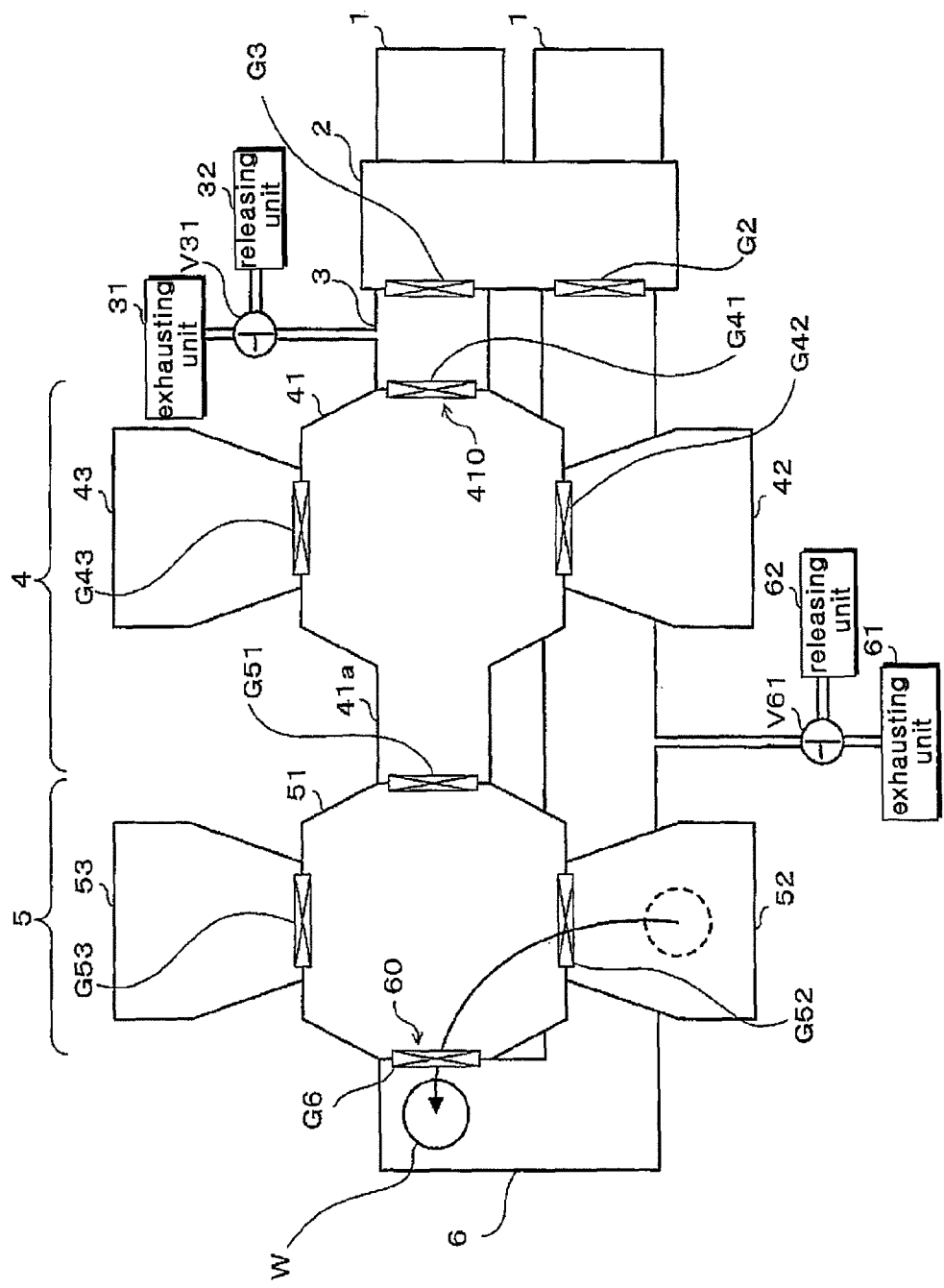
FIG. 6 is an explanatory view illustrating a transfer process.
Figure 7:
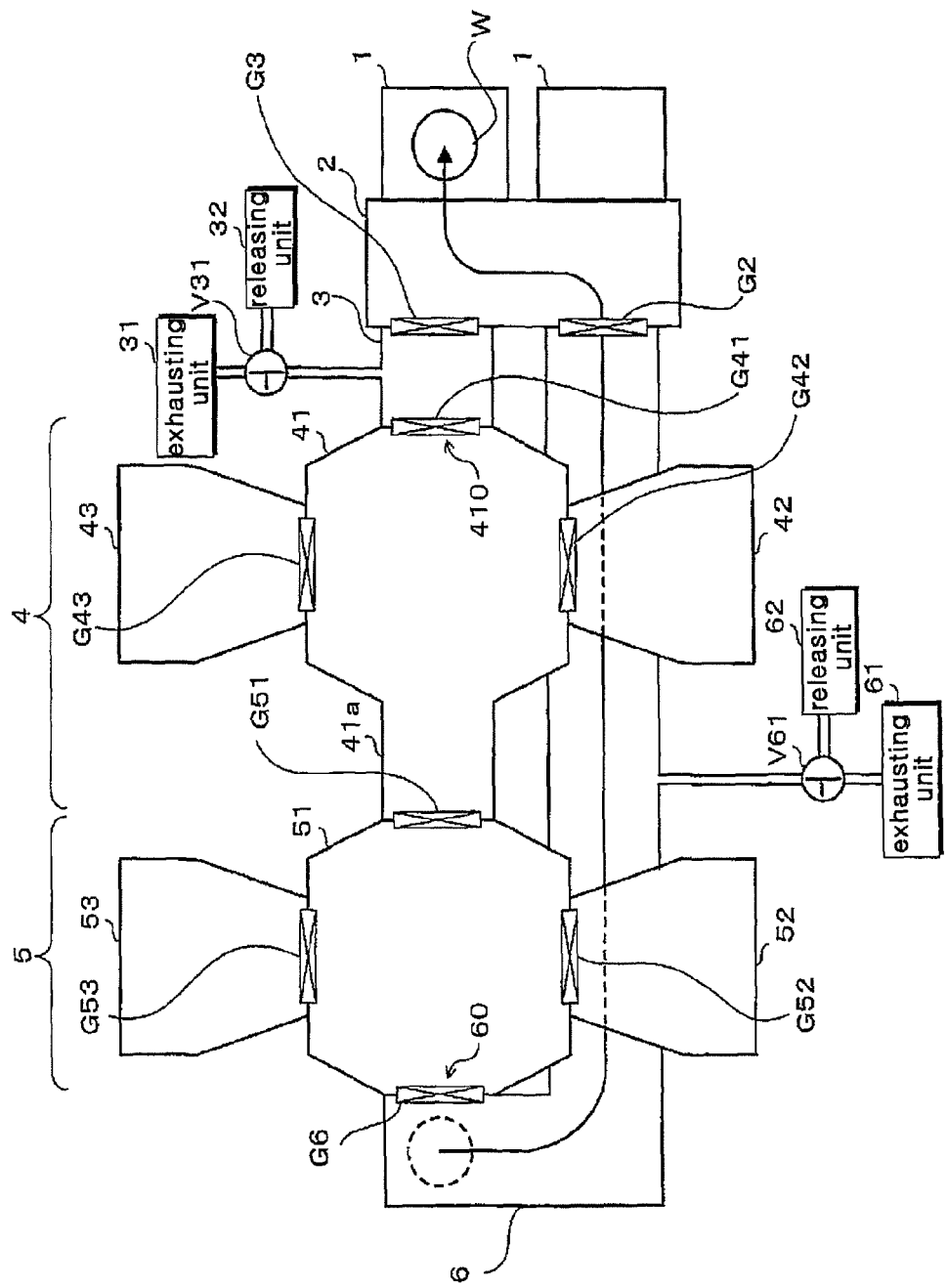
FIG. 7 is an explanatory view illustrating a transfer process.

When the wafer W transferred from the housing section 1 to the load-lock chamber 3 is further subjected to a processing within, for example, the chamber 52 included in the second cluster 5, the transfer arm A41 transfers the wafer W from the load-lock chamber 3 to the transfer chamber 41, and further transfers and stores the wafer W into the relay section 41a (see FIG. 4). Also, when the wafer W that has been subjected to a processing within the chambers 42 and 43 included in the first cluster 4 and returned to the transfer chamber 41, is further processed within, for example, the chamber 52 included in the second cluster 5, the transfer arm A41 transfers and stores the wafer W into the relay section 41a. Then, the gate valve G51 is opened, and the wafer W stored in the relay section 41a is received by the transfer arm A51.

When the transfer arm A51 that has received the wafer W transfers the wafer W to the transfer chamber 51 included in the cluster 5, the gate valve G51 is closed. The wafer W transferred to the transfer chamber 51 is transferred to the chamber 52 by the transfer arm A51 and is processed in the same manner as above (see FIG. 5). When the processing within the chamber 52 is completed, the gate valve G6 is opened. Then, using the transfer arm A6, the wafer W within the transfer chamber 51 is carried into the carry-out chamber 6 of which the inside is in a vacuum state, and the gate valve G6 is closed (see FIG. 6). The opening section 62 is connected to the carry-out chamber 6 via the valve V61 and starts to introduce a gas into the carry-out chamber 6 so that the inside of the carry-out chamber 6 can be placed in an atmospheric pressure state.

The transfer arm A6 holding the wafer W horizontally moves and moves down toward the parallel moving section 63 by the horizontally moving section X6 and the vertically moving section Z6. The wafer W is transferred and disposed to the parallel moving section 63 by the transfer arm A6. The parallel moving section 63 moves the wafer W toward the gate valve G2, and stops just in front of the gate valve G2. When the inside of the carry-out chamber 6 reaches the atmospheric state, the gate valve G2 is opened. Then, the wafer W disposed on the parallel moving section 63 is returned to the housing section 1 by the transfer arm A2.

In the present exemplary embodiment 1, when the wafer W transferred to the second cluster 5 via the first cluster 4 is returned to the housing section 1, the wafer W is carried out through the inside of the carry-out chamber 6, thereby eliminating a process of returning the wafer W to the first cluster 4. Thus, processing may be performed at high efficiency. Also, the carry-out chamber 6 has a load-lock function in which the wafer W is carried in from the transfer chamber 51 after the inside pressure of the carry-out chamber 6 is decompressed to a vacuum state, and the wafer W is carried out to the atmospheric transfer section 2 after the inside pressure reaches an atmospheric pressure state. Thus, it is not required to use the load-lock chamber 3 in order to carry out the wafer W. Accordingly, it is possible to sequentially carry wafers W into the transfer chamber 41 using the load-lock chamber 3. Thus, high efficiency for the processing may be achieved. The carry-out chamber 6 extends below the first cluster 4 and the second cluster 5 and is connected to the atmospheric transfer section 2. Accordingly, it is possible to suppress an increase of the occupied area of the substrate processing apparatus caused by providing the carry-out chamber 6.

The present disclosure is not limited to the case where the carry-out chamber 6 includes the transfer arm A6 configured to be moved by the horizontally moving section X6 and the vertically moving section Z6. The carry-out chamber 6 may include a moving stage, instead of the transfer arm A6, which downwardly moves with an inclination toward the parallel moving section 63. Also, the present disclosure is not limited to the case where a section of the carry-out chamber 6, in which the parallel moving section 63 is received, is disposed in a space below the first cluster 4 and the second cluster 5 (see FIG. 7). The section of the carry-out chamber 6 may be disposed in a space above the first cluster 4 and the second cluster 5. Herein, the carry-out chamber 6 extends and bends toward the upper side of the first cluster 4 and the second cluster 5, and then extends in the space above the first cluster 4 and the second cluster 5 to be connected to the atmospheric transfer section 2. The transfer arm A6 holding the wafer W may horizontally move and move up toward the parallel moving section 63 by the horizontally moving section X6 and the vertically moving section Z6.

The parallel moving section 63 should move the wafer W toward the atmospheric transfer section 2. However, the present disclosure is not limited to the case where the parallel moving section 63 moves in almost parallel to the connection direction of the first and second clusters 4 and 5. For example, the parallel moving section 63 may move the wafer W toward the atmospheric transfer section 2 while moving in a direction receding from or approaching the first cluster 4 and the second cluster 5 at a predetermined angle to the connection direction of the first cluster 4 and the second cluster 5. Also, for example, the parallel moving section 63 may move the wafer W toward the atmospheric transfer section 2 by moving upwardly or downwardly.

The carry-out chamber 6 may nearly horizontally extend and bend from the other end of the transfer chamber 51 toward the lateral side of the first cluster 4 and the second cluster 5, and extend at the lateral side of the first cluster 4 and the second cluster 5 in almost parallel to the connection direction of the first cluster 4 and the second cluster 5, and then be connected to the atmospheric transfer section 2. Herein, the transfer arm A6 holding the wafer W may horizontally move toward the parallel moving section 63 by the horizontally moving section X6, and do not require the vertically moving section Z6. Accordingly, it is possible to suppress an increase of the occupied volume in the upper and lower spaces of the first cluster 4 and the second cluster 5 caused by providing the carry-out chamber 6.

In the present first exemplary embodiment, the substrate processing apparatus includes two connected clusters. However, the present disclosure is not limited thereto. The substrate processing apparatus may include three or more connected clusters. Herein, the carry-out chamber may be provided in a cluster at the rearmost side. Also, when the wafer W that has been subjected to a processing in each cluster is returned to the housing section, a carry-out chamber or a load-lock chamber 3 at a position closer to the corresponding cluster is selected. Through the selected carry-out chamber or the load-lock chamber 3, the wafer W may be carried out to the housing section.

The present disclosure is not limited to the substrate processing apparatus that includes a plurality of connected clusters. Only one cluster may be included in the substrate processing apparatus. Accordingly, the wafer W which has been processed may be carried out to the housing section 1 through the carry-out chamber 6 without being returned to the load-lock chamber 3. Thus, it is possible to efficiently process a number of wafers W.

Second Exemplary Embodiment

Figure 8:
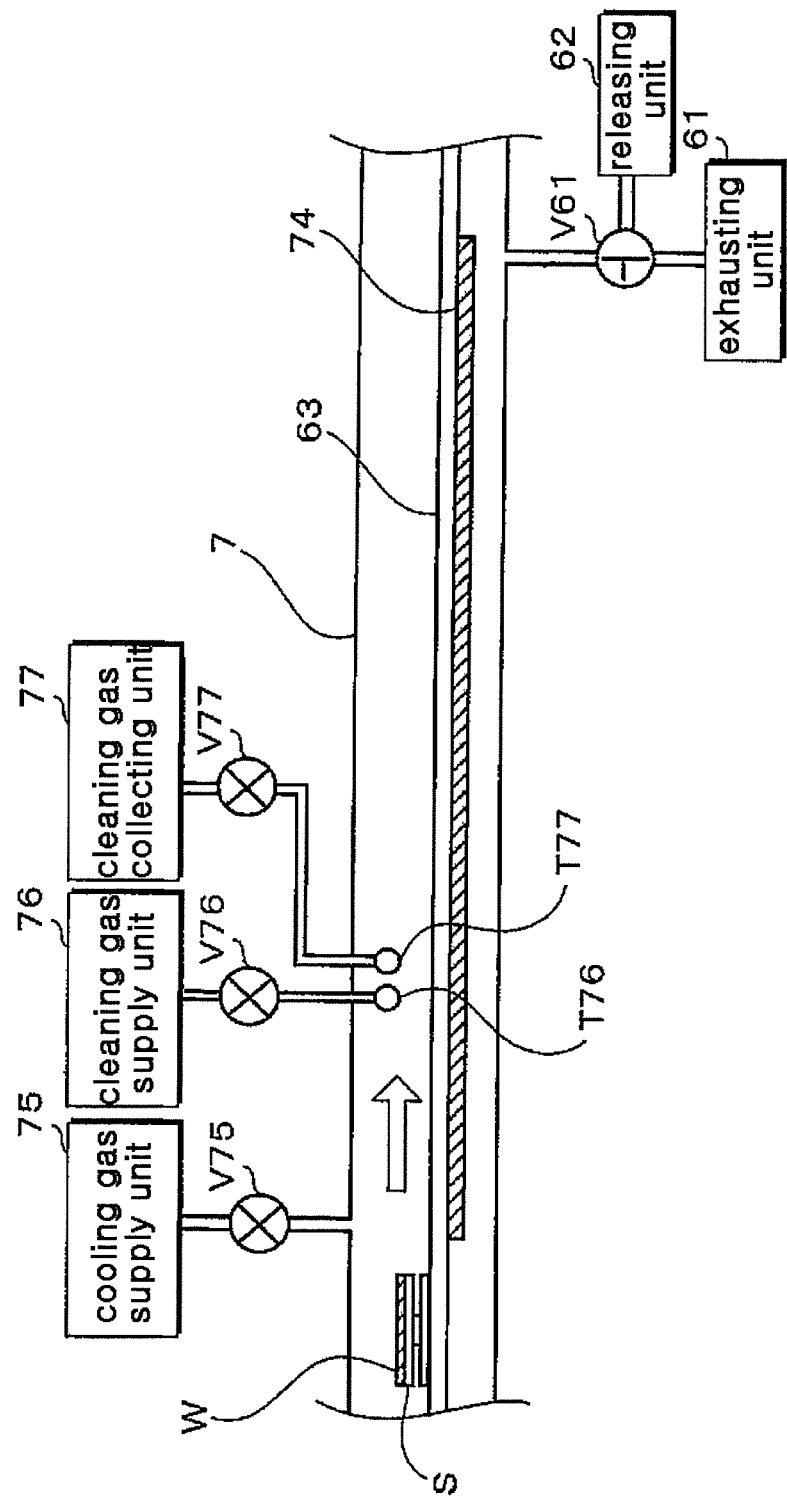
FIG. 8 is a schematic side view illustrating a carry-out chamber according to another exemplary embodiment.

While the carry-out chamber 6 according to the first exemplary embodiment includes a load-lock function, the carry-out chamber according to a second exemplary embodiment further includes functions of heating, cooling and cleaning. FIG. 8 is a schematic side view illustrating a carry-out chamber according to another exemplary embodiment. The white arrow in the drawing indicates a movement direction of a wafer W. A carry-out chamber 7 includes a heating unit 74, a cooling gas supply unit (cooling unit) 75 configured to supply a cooling gas, a cleaning gas supply unit 76 configured to supply a cleaning gas, and a cleaning gas collecting unit 77 configured to collect the cleaning gas. The cleaning gas supply unit 76 is connected to a discharge tube (cleaning unit) T76 via a valve V76. The discharge tube T76 protrudes into the carry-out chamber 7.

The cleaning gas collecting unit 77 is connected to a suction tube T77 via a valve V77. The suction tube T77 protrudes into the carry-out chamber 7. Since other respective parts of the carry-out chamber 7 are the same as those in the first exemplary embodiment, only the components different from those of the first exemplary embodiment will be described. The carry-out chamber 7 includes an exhaust section 61, a opening section 62, a valve V61, a transfer arm A6, a horizontally moving section X6, a vertically moving section Z6, and a parallel moving section 63. The heating unit 74 is a line heater including heating wire or an infrared lamp that is provided at a position beneath the parallel moving section 63 along the parallel moving section 63. The heating unit 74 heats the wafer W that is disposed and moved on the parallel moving section 63. Also, although in the above described example, the heating unit 74 is provided at a position beneath the parallel moving section 63, the present disclosure is not limited thereto. The heating unit 74 may be disposed on, at one side, or beneath the parallel moving section 63. Also, the heating units 74 may be provided at plurality of positions around the parallel moving section 63, such as for example, at positions on and beneath the parallel moving section 63 or at both sides of the parallel moving section 63. When the wafer W that has been processed by a first cluster 4 or a second cluster 5 is heated, the substrate processing apparatus heats the wafer W by the heating unit 74 while the wafer W within the carry-out chamber 7 is carried out to an atmospheric transfer section 2. The heating unit 74 may be provided along the horizontally moving section X6 or the vertically moving section Z6 in order to heat the wafer W horizontally or vertically moved by the horizontally moving section X6 or the vertically moving section Z6.

The cooling gas supply unit 75 is disposed at a position closer to a horizontally moving section X6 side than an opening section 62 side, and supplies an inert gas such as, for example, a nitrogen gas or an argon gas, as a cooling gas, to the carry-out chamber 7. The cooling gas flows along a movement direction of the wafer W within the carry-out chamber 7 and then is discharged from the opening section 62. The cooling gas that flows within the carry-out chamber 7 cools the wafer W moved by the parallel moving section 63. When the wafer W that has been processed within the first cluster 4 or the second cluster 5 is cooled, the substrate processing apparatus cools the wafer W while a valve V75 is opened, and the wafer W within the carry-out chamber 7 is carried out to the atmospheric transfer section 2. The present disclosure is not limited to the case where the cooling gas supply unit 75 is disposed in a portion of the carry-out chamber 7 including the parallel moving section 63 provided therewithin. The cooling gas supply unit 75 may be disposed in another portion of the carry-out chamber 7 in the vicinity of a gate valve G6 so that the wafer W can be cooled even when being moved by the horizontally moving section X6 and the vertically moving section Z6 in the horizontal direction and the vertical direction.

Figure 9:
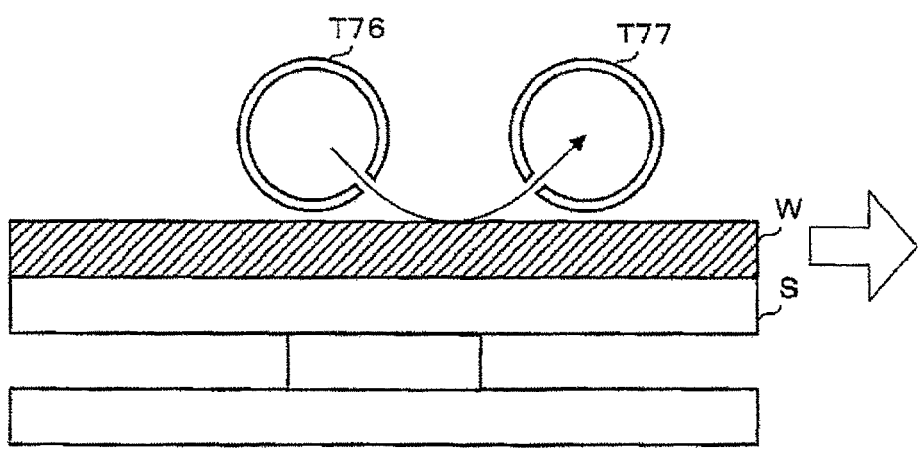
FIG. 9 is an explanatory view illustrating a cleaning method.

The cleaning gas supply unit 76 supplies an activated gas capable of decomposing the extraneous materials attached on the surface of the wafer W, as a cleaning gas, to the carry-out chamber 7. For example, when the extraneous materials of the wafer W are CF-based (fluorocarbon-based) polymers, a gas including oxygen or ozone capable of decomposing the CF-based polymer may be used. Also, a UV lamp capable of decomposing the extraneous materials may be provided so as to improve the cleaning efficiency by the cleaning gas. FIG. 9 is an explanatory view illustrating a cleaning method. The white arrow in the drawing indicates the movement direction of a stage S on which the wafer W is disposed. The arrow in the drawing indicates the flowing direction of the cleaning gas when the cleaning gas is discharged from the discharge tube T76 and sucked into the suction tube T77. The discharge tube T76 and the suction tube T77 are provided in such a manner that they are spaced apart from the surface of the wafer W, and their axial directions are almost perpendicular to the movement direction of the wafer W, and also are almost parallel to the surface of the wafer W.

Also, the discharge tube T76 includes a plurality of discharge holes formed along the axial direction. From a cross-sectional view almost perpendicular to the axial direction, the discharge holes are disposed in such a manner that the discharge direction of each of the discharge holes crosses the discharge tube T76 in a 4 to 5 o'clock direction. The suction tube T77 includes a plurality of suction holes formed along the axial direction. From a cross-sectional view almost perpendicular to the axial direction, the suction holes are disposed in such a manner that the suction direction of each of the suction holes crosses the suction tube T77 in a 7 to 8 o'clock direction. The cleaning gas discharged from the discharge holes of the discharge tube T76 comes in contact with the surface of the wafer W, rebounds from the surface, and is sucked into the suction holes of the suction tube T77. While the wafer W is moved, the entire surface of the wafer W is cleaned by coming in contact with the cleaning gas. The discharge tube T76 and the suction tube T77 may be provided along the horizontally moving section X6 or the vertically moving section Z6 so that they can clean the wafer W horizontally or vertically moved by the horizontally moving section X6 or the vertically moving section Z6.

According to the present exemplary embodiment, it becomes possible that the wafer W having been processed within the first cluster 4 or the second cluster 5 may be further subjected to heating, cooling and cleaning processing by the carry-out chamber 7 when returned to the housing section 1. Also, although in the present exemplary embodiment, the carry-out chamber 7 has a configuration required for all of the processing such as heating, cooling and cleaning processing, the present disclosure is not limited thereto. The carry-out chamber 7 may have a configuration required for any one of heating, cooling and cleaning processing on the wafer W moving within the carry-out chamber 7.

Third Exemplary Embodiment

Figure 10:
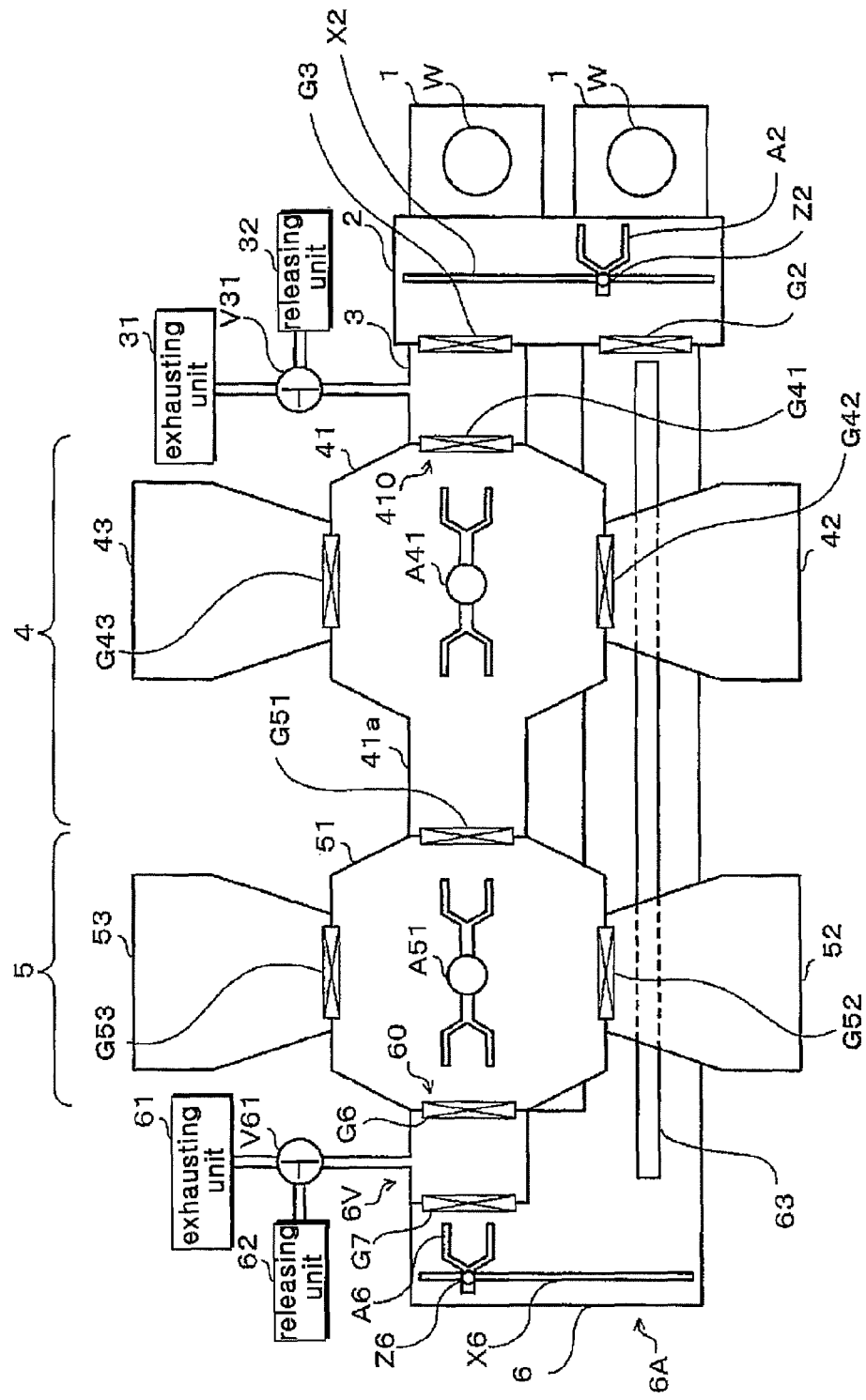
FIG. 10 is a schematic plan view illustrating a substrate processing apparatus according to a third exemplary embodiment.
Figure 11:
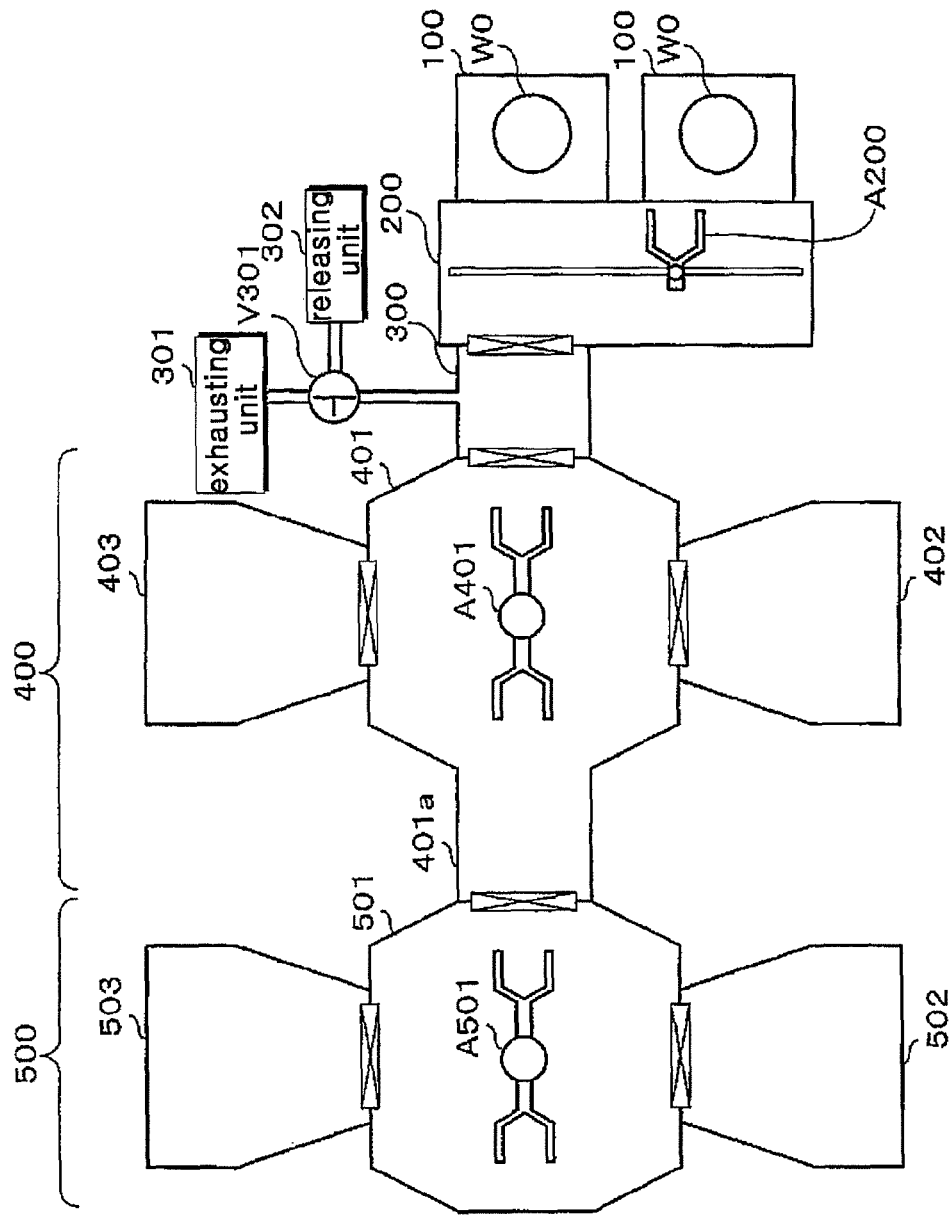
FIG. 11 is a schematic plan view illustrating a conventional substrate processing apparatus.

In a substrate processing apparatus according to a third exemplary embodiment, the carry-out chamber 6 includes two chambers such as a pressure control chamber and a subsidiary carry-out chamber placed in an atmospheric pressure state. FIG. 10 is a schematic plan view illustrating a substrate processing apparatus according to a third exemplary embodiment. The carry-out chamber 6 includes a pressure control chamber 6V that controls a pressure from a vacuum state to an atmospheric pressure state, or from an atmospheric pressure state to a vacuum state, and a subsidiary carry-out chamber 6A that carries out the wafer W carried out from the pressure control chamber 6V under an atmospheric pressure state, to the housing section 1. The pressure control chamber 6V includes not only a gate valve G6 and a gate valve G7 but also an exhaust section 61, a valve V61 and a opening section 62 which constitute a pressure control section. The pressure control chamber 6V is connected to a transfer chamber 51 via a second opening 60 and the gate valve G6.

The exhaust section 61 configured to decompress the inside, and the opening section 62 configured to recover the inside to an atmospheric pressure are connected to the pressure control chamber 6V via the valve V61. The opening section 62 gradually introduces an inert gas such as, for example, a nitrogen gas and an argon gas into the pressure control chamber 6V, thereby controlling the inside of the pressure control chamber 6V to the atmospheric pressure state. The valve V61 is a switching valve that connects any one of the exhaust section 61 and the opening section 62 to the pressure control chamber 6V. The inside of the pressure control chamber 6V is decompressed to almost the same level as that of a vacuum state of the transfer chamber 51 by the exhaustion of the exhaust section 61 while the gate valve G6 and the gate valve G7 are closed and the exhaust section 61 is connected to the pressure control chamber 6V via the valve V61. Also, a transfer mechanism (not illustrated) such as for example, a belt conveyor or a transfer robot, may be provided in the pressure control chamber 6V so as to transfer the wafer W from the transfer chamber 51 to the subsidiary carry-out chamber 6A.

The subsidiary carry-out chamber 6A is formed in an L shape from a plan view, in which one end is connected to the gate valve G7 of the pressure control chamber 6V, and the other end at downstream is connected to a gate valve G2 of an atmospheric transfer section 2. The subsidiary carry-out chamber 6A includes a vertically moving section Z6, a horizontally moving section X6 and a parallel moving section 63 which constitute the transfer section as described in the first exemplary embodiment. Also, the subsidiary carry-out chamber 6A may include the line heater 74, the cooling gas supply unit 75, the cleaning gas supply unit 76 or the cleaning gas collecting unit 77 as described in the second exemplary embodiment. Hereinafter, the carrying-out process of the wafer W will be described. The pressure control chamber 6V is exhausted by the exhaust section 61 and is decompressed to almost the same level as that of the vacuum state of the transfer chamber 51 while the gate valve G6 and the gate valve G7 are closed. After the decompression, the pressure control chamber 6V opens the gate valve G6. The transfer arm A51 transfers the wafer W to the pressure control chamber 6V through the second opening 60. After the wafer W is carried out, the pressure control chamber 6V closes the gate valve G6 again. Then, the opening section 62 controls the pressure within the pressure control chamber 6V to the atmospheric pressure state. The pressure control chamber 6V is returned to the atmospheric pressure state, and opens the gate valve G7. The transfer arm A6 transfers the wafer W from the pressure control chamber 6V to the subsidiary carry-out chamber 6A.

After the wafer W is carried out, the pressure control chamber 6V closes the gate valve G7. The subsidiary carry-out chamber 6A carries out the wafer W to the atmospheric transfer section 2 using the vertically moving section Z6, the horizontally moving section X6 and the parallel moving section 63. The wafer W carried out to the atmospheric transfer section 2 via the gate valve G2, which has been processed, is finally transferred to the housing section 1. According to the present exemplary embodiment, the carry-out chamber 6 is divided into two chambers such as the pressure control chamber 6V for pressure control and the subsidiary carry-out chamber 6A for carrying-out because it takes a time to control the pressure to the vacuum state or the atmospheric pressure state. Accordingly, it is possible to further improve the efficiency at carrying-out of the wafer W.

While the present third exemplary embodiment has been described above, other configurations and operations are the same as those in the first or second exemplary embodiment. Thus, the components corresponding to those in the first or second exemplary embodiment are assigned with the same numerals, and will not be described in detail.

EXPLANATION OF REFERENCE NUMERALS AND SYMBOLS 1, 100: housing section
2, 200: atmospheric transfer section
3, 300: load-lock chamber (carry-in section)
4, 400: first cluster
5, 500: second cluster
6, 7: carry-out chamber
6V: pressure control chamber
6A: subsidiary carry-out chamber
W, W0: wafer (substrate)
31, 61, 301: exhaust section (pressure control section)
32, 62, 302: opening section (pressure control section)
V31, V61, V75~V77, V301: valve
41, 51, 401, 501: transfer chamber
41a, 401a: relay section
A2: transfer arm (carry-in section)
A41, A51, A401, A501: transfer aim
A6: transfer arm (carry-out section)
42, 43, 52, 53, 402, 403, 503, 503: chamber (airtight chamber)
60: second opening
63: parallel moving section (carry-out section)
74: heating unit
75: cooling gas supply unit (cooling unit)
76: cleaning gas supply unit
77: cleaning gas collecting unit
410: first opening
T76: discharge tube (cleaning unit)
T77: suction tube
G2, G3, G7, G41□G43, G51□G53, G6: gate valve
X2: horizontally moving section
X6: horizontally moving section (carry-out section)
Z2: vertically moving section
Z6: vertically moving section (carry-out section)

The invention claimed is:

1. A substrate processing apparatus comprising:
a housing section configured to house a substrate;
a plurality of transfer chambers including at least a first transfer chamber and a second transfer chamber connected in a series connection along a nearly horizontal direction to transfer the substrate therebetween, each of the plurality of transfer chambers including a plurality of airtight chambers connected to the periphery thereof, and a transfer mechanism provided therewithin, each of the plurality of airtight chambers being configured to process the substrate under an airtight state, and the transfer mechanism being configured to transfer the substrate to and from the airtight chambers;
a carry-in section configured to carry the substrate from the housing section either into the first transfer chamber via a first opening provided in the first transfer chamber or into the second transfer chamber via the first opening and a relay section provided in the first transfer chamber to be connected to the second transfer chamber; and
a carry-out section configured to carry out the substrate discharged from the second transfer chamber via a second opening provided in the second transfer chamber and connected to the carry-out section, such that the substrate is transferred from the second transfer chamber directly to the housing section, without returning the substrate to the first transfer chamber,
wherein the carry-out section includes a first moving section configured to move, via the second opening, the substrate discharged from the second transfer chamber in a vertical direction with a vertical transfer arm and a second moving section configured to move the substrate in a horizontal direction such that the substrate is transferred to the housing section substantially in a direction of the series connection of the first transfer chamber and the second transfer chamber.

2. The substrate processing apparatus of claim 1, wherein the carry-out section is provided with a pressure control section configured to control an inner pressure thereof, and
the carry-out section is configured to switch between a decompressed state and atmospheric state in order to carry in the substrate from the second transfer chamber by controlling the inner pressure to almost the same level as that of the second transfer chamber by the pressure control section, and to carry out the substrate to the housing section by controlling the inner pressure to almost the same level as that of the housing section by the pressure control section.

3. The substrate processing apparatus of claim 1, further comprising: a pressure control chamber provided between the carry-out section and the transfer chamber; and
a pressure control section which controls a pressure of the pressure control chamber to a vacuum state before the substrate is discharged from the transfer chamber to the pressure control chamber, and controls the pressure of the pressure control chamber to an atmospheric pressure state before the substrate is carried out from the pressure control chamber to the carry-out section.

4. The substrate processing apparatus of claim 1, wherein the carry-out section is provided with a heating unit configured to heat the substrate.

5. The substrate processing apparatus of claim 1, wherein the carry-out section is provided with a cooling unit configured to cool the substrate.

6. The substrate processing apparatus of claim 1, wherein the carry-out section is provided with a cleaning unit configured to clean the substrate.

7. The substrate processing apparatus of claim 1, wherein the second moving section of the carry-out section is disposed above or below the plurality of transfer chambers.

\* \* \* \* \*